(12) United States Patent
Noh et al.

(10) Patent No.: US 11,871,616 B2
(45) Date of Patent: Jan. 9, 2024

(54) ORGANIC LIGHT EMITTING DISPLAY DEVICE

(71) Applicant: LG Display Co., Ltd., Seoul (KR)

(72) Inventors: Sangsoon Noh, Goyang-si (KR); Eunsung Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 17/515,247

(22) Filed: Oct. 29, 2021

(65) Prior Publication Data
US 2022/0190079 A1    Jun. 16, 2022

(30) Foreign Application Priority Data
Dec. 11, 2020  (KR) .................. 10-2020-0173032

(51) Int. Cl.
*H01L 27/14*     (2006.01)
*H10K 59/121*   (2023.01)
*H10K 59/124*   (2023.01)
*H10K 59/126*   (2023.01)
(Continued)

(52) U.S. Cl.
CPC ....... *H10K 59/1213* (2023.02); *H10K 59/124* (2023.02); *H10K 59/126* (2023.02); *H10K 59/1216* (2023.02); *H01L 27/1225* (2013.01); *H01L 27/1251* (2013.01); *H01L 27/1255* (2013.01); *H01L 29/7869* (2013.01); *H01L 29/78633* (2013.01); *H01L 29/78675* (2013.01)

(58) Field of Classification Search
CPC ........... H10K 59/1213; H10K 59/1216; H10K 59/124; H10K 59/126; H10K 59/12; H01L 27/1225; H01L 27/1251; H01L 27/1255; H01L 29/78633; H01L 29/78675; H01L 29/7869; H01L 29/78696; H01L 27/1248; H01L 27/1218; H01L 27/124; H01L 27/3272; H01L 27/3265; H01L 27/3262; H01L 27/3244; H01L 27/3258
USPC .................................................... 257/59, 72
See application file for complete search history.

(56) References Cited

U.S. PATENT DOCUMENTS 6,768,522 B2 * 7/2004 Yasukawa ......... G02F 1/136209
                                              349/110
8,293,594 B2   10/2012 Yamazaki et al.
(Continued)

FOREIGN PATENT DOCUMENTS

KR   10-2012-0049887 A    5/2012
KR   10-2016-0028587 A    3/2016

*Primary Examiner* — Tan N Tran
(74) *Attorney, Agent, or Firm* — Fenwick & West LLP

(57) ABSTRACT

An organic light emitting display device may include a first thin film transistor including a first active layer formed of a first material and includes a first source region, a first channel region, and a first drain region, a first gate electrode and a first source electrode and a first drain electrode, a second thin film transistor including a second active layer formed of a second material and includes a second source region, a second channel region, and a second drain region, a second gate electrode, and a second source electrode and a second drain electrode, a light blocking layer overlapping a lower portion of the second active layer and formed on the same layer as the second capacitor electrode, and a first protrusion pattern and a second protrusion pattern disposed on the same layer as the first gate electrode and overlapping the light blocking layer.

22 Claims, 7 Drawing Sheets

(51) Int. Cl.
*H01L 29/786* (2006.01)
*H01L 27/12* (2006.01)

(56) References Cited

U.S. PATENT DOCUMENTS

| | | | |
|---|---|---|---|
| 8,569,147 B2 * | 10/2013 | Tada | H01L 27/1218 438/459 |
| 8,643,018 B2 | 2/2014 | Yamazaki et al. | |
| 10,741,625 B2 * | 8/2020 | Kang | H10K 59/123 |
| 2011/0012118 A1 | 1/2011 | Yamazaki et al. | |
| 2013/0015439 A1 | 1/2013 | Yamazaki et al. | |
| 2016/0062200 A1 | 3/2016 | Jung et al. | |

* cited by examiner

ORGANIC LIGHT EMITTING DISPLAY DEVICE

CROSS-REFERENCE TO RELATED APPLICATIONS

This application claims the benefit of and priority to Republic of Korea Patent Application No. 10-2020-0173032 filed on Dec. 11, 2020 in the Republic of Korea, the entire contents of which are hereby incorporated by reference into the present application.

BACKGROUND

Technical Field

The present disclosure relates to an organic light emitting display device including a multi-type thin film transistor, and more particularly, to an organic light emitting display device in which different types of thin film transistors are disposed on a single substrate.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Specific examples of such a display device include a liquid crystal display (LCD), and electroluminescent display devices such as an organic light emitting display (OLED) and a quantum dot light emitting display (QLED). In particular, the electroluminescent display device is a next-generation display device having self-luminous properties, and has superior characteristics in terms of a viewing angle, contrast, a response speed, power consumption, and the like, compared to the liquid crystal display.

The electroluminescent display device includes a display area for displaying an image and a non-display area disposed adjacent to the display area. In addition, a pixel area includes a pixel circuit and light emitting elements. A plurality of thin film transistors are positioned in the pixel circuit to drive the light emitting elements disposed in a plurality of pixels.

Thin film transistors may be classified according to a material constituting a semiconductor layer. Among them, a low temperature poly-silicon (LTPS) thin film transistor and an oxide semiconductor thin film transistor are the most widely used transistors. Meanwhile, technology of electroluminescent display devices in which an LTPS thin film transistor and an oxide semiconductor thin film transistor are formed on the same substrate is being actively developed.

SUMMARY

The inventors of the present disclosure have recognized that, in a method of manufacturing a display device, operating characteristics of a pixel can be improved by forming a plurality of thin film transistors with different semiconductors.

Accordingly, in order to form a plurality of thin film transistors with different semiconductors, the inventors of the present disclosure have invented a display device capable of reducing damage to semiconductor elements while forming respective semiconductors of the plurality of thin film transistors on different layers.

Meanwhile, a defect in which a thin film transistor formed of an oxide semiconductor has variations in oxide semiconductor element under an influence of external light was found. For example, there was a defect in which a current rise occurs in the thin film transistor formed of the oxide semiconductor by external light, thereby increasing luminance. Accordingly, an object of the present disclosure is to provide a display device capable of reducing damage to a thin film transistor formed of an oxide semiconductor.

Objects of the present disclosure are not limited to the above-mentioned objects, and other objects, which are not mentioned above, can be clearly understood by those skilled in the art from the following descriptions.

In order to achieve the object as described above, an organic light emitting display device according to an exemplary embodiment of the present disclosure may include a substrate including a first substrate, a second substrate, and an inorganic insulating layer disposed between the first substrate and the second substrate. A first buffer layer may be positioned on the substrate. The organic light emitting display device may include a first thin film transistor including a first active layer that is formed of a first material and includes a first source region, a first channel region, and a first drain region, a first gate electrode that overlaps the first active layer with a first gate insulating layer interposed therebetween, and a first source electrode and a first drain electrode that are electrically connected to the first active layer. The organic light emitting display device may include a second thin film transistor including a second active layer that is formed of a second material and includes a second source region, a second channel region, and a second drain region, a second gate electrode that overlaps the second active layer with a second gate insulating layer interposed therebetween, and a second source electrode and a second drain electrode that are electrically connected to the second active layer. The organic light emitting display device may include a storage capacitor including a first capacitor electrode that is disposed on the same layer as the first gate electrode, and a second capacitor electrode that overlaps the first capacitor electrode with a first interlayer insulating layer interposed therebetween. The organic light emitting display device may include a light blocking layer overlapping a lower portion of the second active layer and formed on the same layer as the second capacitor electrode. The organic light emitting display device may include a first protrusion pattern and a second protrusion pattern disposed on the same layer as the first gate electrode and overlapping the light blocking layer, and a distance between the first protrusion pattern and the second protrusion pattern may be greater than a width of the second channel region of the second active layer.

In another embodiment, an organic light emitting display device may include a substrate, a first thin film transistor on the substrate, the first thin film transistor including a first active layer formed of a first material, a second thin film transistor on the substrate, the second thin film transistor including an active layer formed of a second material and including a source region, a channel region, and a drain region, a gate insulating layer on the active layer, and a gate electrode on the gate insulating layer and overlapping the active layer, a light blocking layer overlapping the active layer, the light blocking layer having a first portion below the channel region and a second portion that extends upward to horizontally overlap with at least a part of the active layer.

Other detailed matters of the exemplary embodiments are included in the detailed description and the drawings.

In an organic light emitting display device according to an exemplary embodiment of the present disclosure, a light blocking layer can be disposed under an oxide semiconductor layer to block light introducing through a lower portion of the oxide semiconductor layer. In addition, by forming a protrusion pattern under the light blocking layer, a sidewall is formed on the light blocking layer disposed over the protrusion pattern due to the protrusion pattern, so that light incident through the lower portion of the oxide semiconductor layer and lateral light incident through a side surface of the oxide semiconductor layer can also be blocked. Therefore, it is possible to provide a highly reliable display device by preventing variations in oxide semiconductor element due to external light.

The effects according to the present disclosure are not limited to the contents exemplified above, and more various effects are included in the present specification.

DETAILED DESCRIPTION

Figure 1:
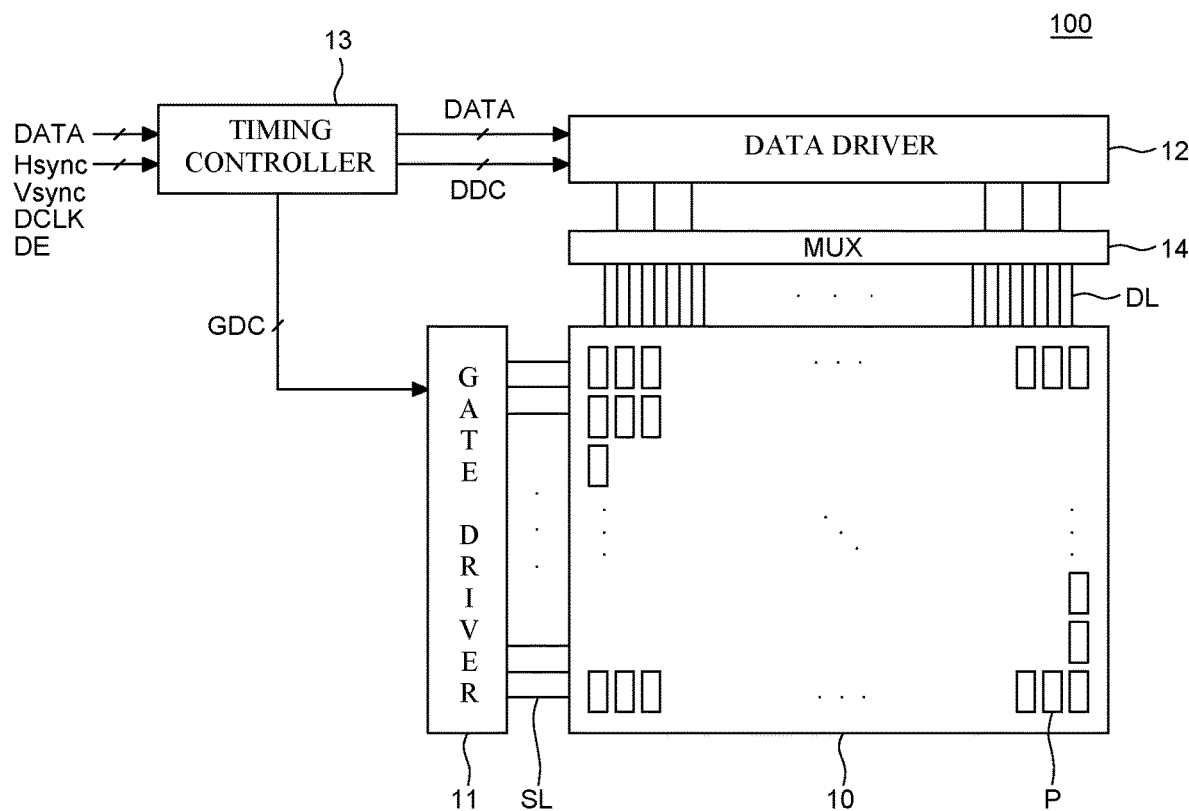
FIG. 1 is a block diagram illustrating an organic light emitting display device including a multi-type thin film transistor according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

In an organic light emitting display device including multi-type thin film transistors according to an exemplary embodiment of the present disclosure, at least two types of thin film transistors may be formed on the same substrate. The multi-type thin film transistors refer to different types of thin film transistors formed on a single substrate. Here, as at least two types of thin film transistors, a low temperature poly-silicon (LTPS) thin film transistor using a polysilicon material as an active layer and an oxide semiconductor thin film transistor using a metal oxide as an active layer may be used.

In the organic light emitting display device including the multi-type thin film transistors according to an exemplary embodiment of the present disclosure, an LTPS thin film transistor using LTPS is used as a thin film transistor using a polysilicon material as an active layer. Since the polysilicon material has low energy consumption and excellent reliability due to high mobility (100 $cm^2$/Vs or more) thereof, the LIPS thin film transistor may be applied to a multiplexer MUX and/or a gate driver for driving elements that drive thin film transistors for display elements. That is, a transistor constituting the gate driver GD may be the LTPS thin film transistor. It is preferable to be applied as a driving thin film transistor in a pixel in the organic light emitting display device.

In the organic light emitting display device including multi-type thin film transistors according to an exemplary embodiment of the present disclosure, an oxide semiconductor thin film transistor using an oxide semiconductor material as an active layer may be used. Since the oxide semiconductor material has a bandgap greater than that of a silicon material, electrons do not pass the bandgap in an off state and thus, off-current is low. Accordingly, the oxide semiconductor thin film transistor is suitable for a switching thin film transistor having a short on-time and a long off-time. In addition, since the off-current is small, a size of an auxiliary capacitor can be reduced, so that the oxide semiconductor thin film transistor is suitable for a high-resolution display device.

The organic light emitting display device including multi-type thin film transistors according to an exemplary embodiment of the present disclosure may provide an improved function by disposing an LPTS thin film transistor and an oxide semiconductor thin film transistor having different properties on the same substrate.

FIG. 1 is a block diagram illustrating an organic light emitting display device including a multi-type thin film transistor according to an exemplary embodiment of the present disclosure.

Referring to FIG. 1, an organic light emitting display device 100 includes an organic light emitting display panel 10, a gate driver 11, a data driver 12, a multiplexer (MUX) 14, and a timing controller 13.

The timing controller 13 controls a display panel driving circuit including the gate driver 11 and the data driver 12 for writing data of an input image to pixels P of the organic light emitting display panel 10. When the organic light emitting display panel 10 further includes a touch sensing unit, the display panel driving circuit may further include a touch sensing driving unit.

In the organic light emitting display panel 10, a plurality of data lines DL and a plurality of scan lines SL cross each other, and a plurality of the pixels P are disposed in a matrix form. In addition, various lines such as an initialization voltage line, an emission control signal line, a high potential voltage line, and a low potential voltage line may be further disposed in the organic light emitting display panel 10.

Each of the plurality of pixels P is a pixel for realizing one color, and the plurality of pixels P may include a red pixel, a green pixel, and a blue pixel. Also, in order to improve a luminance and lifespan of the organic light emitting display panel 10, the plurality of pixels P may further include a white pixel. The red pixel, the green pixel, and the blue pixel (and the white pixel) form one group, so that a desired color can be realized.

The data driver 12 converts digital video data DATA of the input image received from the timing controller 13 into an analog data voltage every frame, and then supplies the data voltage to the data lines DL. The data driver 12 may output the data voltage using a digital-to-analog converter (DAC) that converts digital data into a gamma compensation voltage.

The multiplexer 14 may be disposed between the data driver 12 and the data lines DL of the organic light emitting display panel 10. The multiplexer 14 may reduce the number of output channels of the data driver 12 by dividing a data voltage output through one output channel from the data driver 12 into N (N is a positive integer greater than or equal to 2) channels. The multiplexer 14 may be omitted depending on a resolution and use of the organic light emitting display device 100. The multiplexer 14 may be configured as a switch circuit, and the switch circuit is turned on/off under the control of the timing controller 13.

The gate driver 11 outputs a scan signal and an emission control signal under the control of the timing controller 13 and selects the pixel P that is charged with a data voltage through the scan line SL and adjusts an emission timing. The gate driver 11 may shift the scan signal and the emission control signal using a shift register, and sequentially supply the corresponding signals to the scan line SL. The shift register of the gate driver 11 may be directly formed on a substrate of the organic light emitting display panel 10 using a gate-driver in panel (GIP) method.

The timing controller 13 receives digital video data DATA of an input image and timing signals synchronized with the digital video data DATA from a host system. The timing signals may include a vertical synchronization signal Vsync, a horizontal synchronization signal Hsync, a clock signal DCLK, a data enable signal DE and the like. The host system may be any one of various electronic devices such as a television system, a set-top box, a navigation system, a DVD player, a Blu-ray player, a personal computer (PC), a home theater system, a phone system, and the like.

The timing controller 13 may generate a data timing control signal DDC for controlling an operation timing of the data driver 12, MUX selection signals MUX_R, MUX_G, and MUX_B for controlling an operation timing of the multiplexer 14, and a gate timing control signal GDC for controlling an operation timing of the gate driver 11 based on the timing signals Vsync, Hsync, DCLK and DE that are received from the host system.

The data timing control signal DDC may include a source start pulse SSP, a source sampling clock SSC, a polarity control signal POL, and a source output enable signal SOE, and the like. The source start pulse SSP controls a sampling start timing of the data driver 12. The source sampling clock SSC is a clock for shifting a data sampling timing. The polarity control signal POL controls polarity of a data signal output from the data driver 12. If a signal transmission interface between the timing controller 13 and the data driver 12 is a mini-LVDS (low voltage differential signaling) interface, the source start pulse SSP and the source sampling clock SSC may be omitted.

The gate timing control signal GDC includes a gate start pulse GSP, a gate shift clock CLK, a gate output enable signal GOE, and the like. In the case of a GIP circuit, the gate output enable signal GOE may be omitted. The gate start pulse GSP is generated once at the beginning of the frame period in every frame period and is input to the shift register. The gate start pulse GSP controls a start timing at which a gate pulse of a first block is output in every frame period. The clock CLK is input to the shift register to control a shift timing of the shift register. The gate output enable signal GOE defines an output timing of the gate pulse.

Figure 2A:
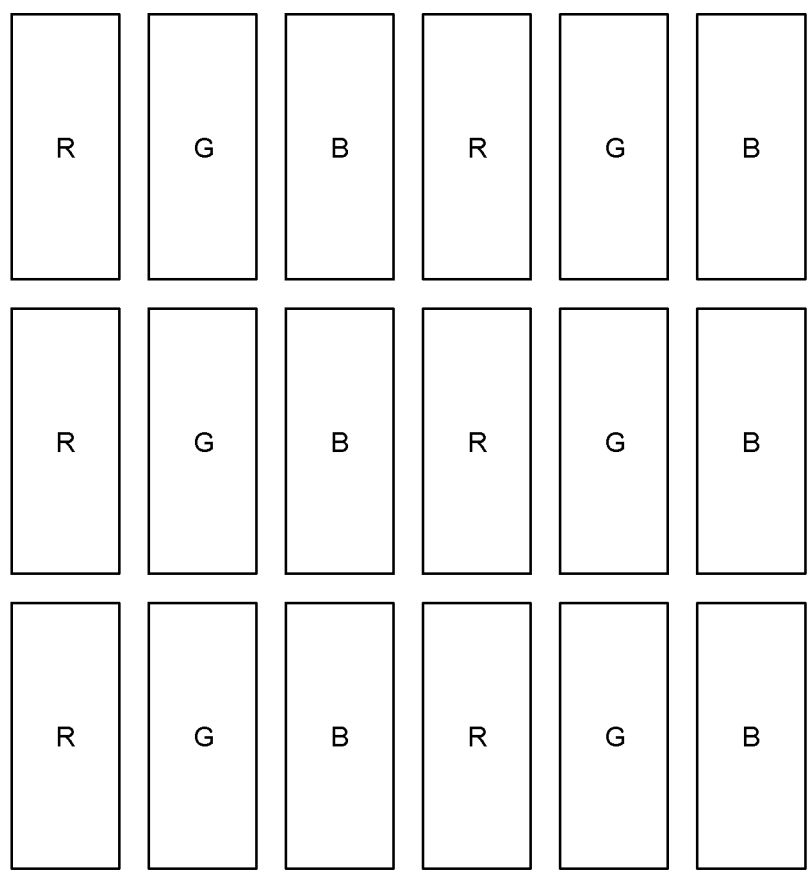
FIG. 2A and FIG. 2B are plan views of sub-pixels disposed in an active area AA illustrated in FIG. 1 according to embodiments of the present disclosure.
Figure 2B:
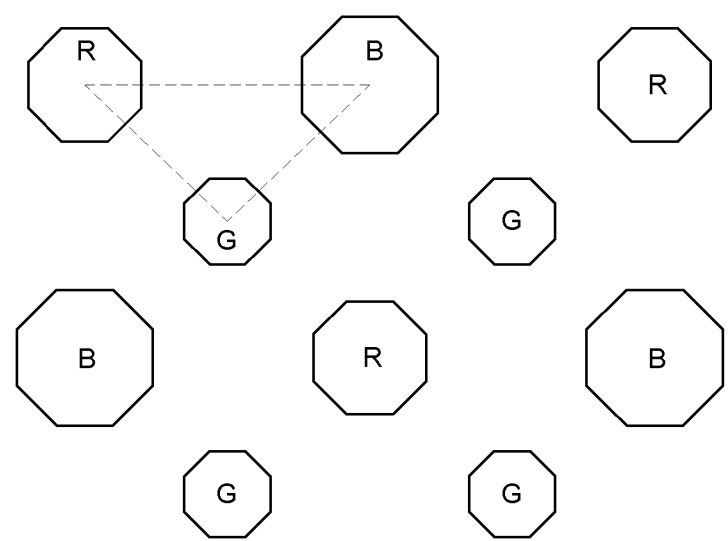

FIG. 2A and FIG. 2B are plan views of sub-pixels disposed in an active area AA illustrated in FIG. 1 according to embodiments of the present disclosure.

The active area AA displays an image through unit pixels disposed in a matrix form. The unit pixel is composed of red (R), green (G), and blue (B) sub-pixels, or is composed of red (R), green (G), blue (B), and white (W) sub-pixels. For example, red (R), green (G), and blue (B) sub-pixels may be disposed in a row on the same imaginary horizontal line, as shown in FIG. 2A, or red (R) green (G), and blue (B) sub-pixels may be disposed to be spaced apart from each other and arranged in a virtual triangular structure, as shown in FIG. 2B. A shape of the unit pixel is not limited to those of FIGS. 2A and 2B and may be implemented variously.

Figure 3:
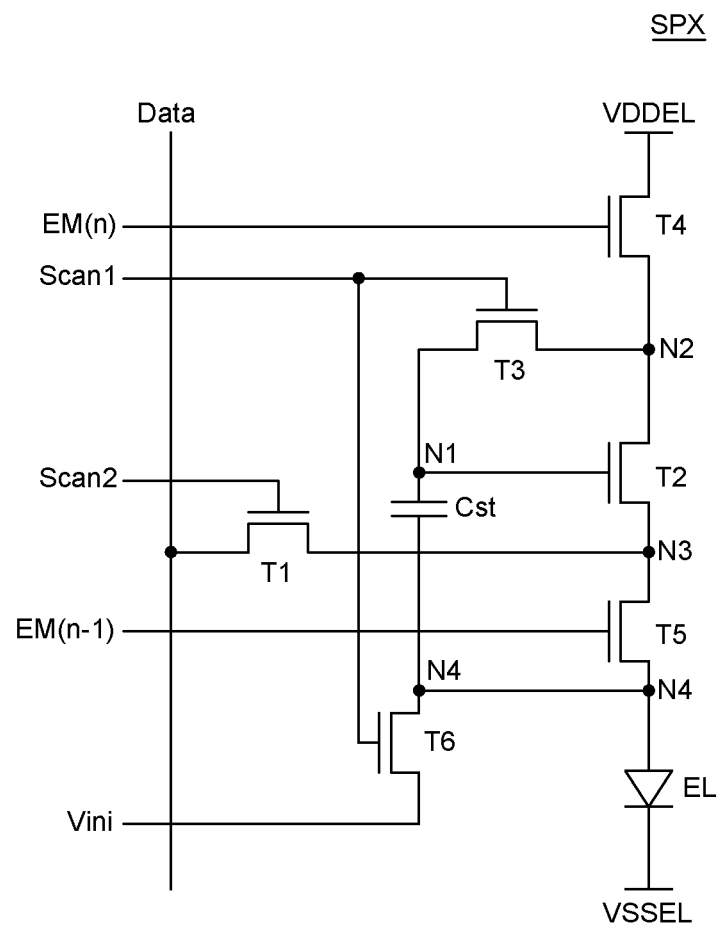
FIG. 3 is a circuit diagram illustrating one pixel driving circuit in the display device according to an exemplary embodiment of the present disclosure.

FIG. 3 is a circuit diagram illustrating one pixel driving circuit in the display device according to an exemplary embodiment of the present disclosure. A sub-pixel SPX includes a light emitting element EL and a pixel driving circuit, and the pixel driving circuit includes six transistors and one capacitor to supply a driving current to the light emitting element EL. An equivalent circuit of the sub-pixel SPX illustrated in FIG. 3 is not limited thereto and may be implemented in various manners.

Specifically, the pixel driving circuit includes a driving transistor T2, a first switching transistor T1 and third to sixth switching transistors T3 to T6, and one storage capacitor Cst.

The driving transistor T2 includes a gate node that is connected to a first node N1, a drain node that is connected to a second node N2, and a source node that is connected to a third node N3. The first node N1 is connected to one node of the storage capacitor Cst, the second node N2 is connected to the third switching transistor T3 and a fourth switching transistor T4, and the third node N3 is connected to the first switching transistor T1 and a fifth switching transistor T5. The source node of the driving transistor T2 is electrically connected to an organic light emitting element. The driving transistor T2 may be referred to as a pixel emission driving element.

Specifically, the source node of the driving transistor T2 is connected to a drain node of the fifth switching transistor T5 and the third node N3. In addition, the driving transistor T2 is electrically connected to an anode of the organic light emitting element.

The drain node of the driving transistor T2 is connected to a high potential voltage line providing a high potential voltage VDDEL through the fourth transistor T4. Accordingly, during a light emission period, the driving transistor T2 is turned on by receiving the high potential voltage VDDEL through the fourth transistor T4 and provides a driving current to the light emitting element EL.

The first switching transistor T1 includes a gate node that is connected to a second scan signal line providing a second scan signal Scant, a drain node that is connected to a data line providing a data voltage Data, and a source node that is connected to the third node N3. The first switching transistor T1 is turned on or turned off by the second scan signal Scant. When the first switching transistor T1 is turned on, the data voltage Data is supplied to the third node N3.

The third switching transistor T3 includes a gate node that is connected to a first scan signal line to which a first scan signal Scant is provided, a drain node that is connected to the second node N2, and a source node that is connected to the first node. The third switching transistor T3 may be turned on and diode-connect the gate node and the drain node of the driving transistor T2 to thereby sense a threshold voltage of the driving transistor T2.

The fourth switching transistor T4 includes a gate node that is connected to an nth emission control signal line to which an nth emission control signal EM[n] is provided, a drain node that is connected to the high potential voltage line, and a source node that is connected to the second node N2. The fourth switching transistor T4 is turned on by the nth emission control signal EM[n] and supplies the high potential voltage VDDEL to the drain node of the driving transistor T2.

Thus, the fourth switching transistor T4 supplies the high potential voltage VDDEL to the drain node of the driving transistor T2 so that a drain-source current (hereinafter, it is referred to as Ids) of the driving transistor T2 flows to the light emitting element EL. Accordingly, the driving transistor T2 may express grayscale by adjusting the amount of the current provided to the light emitting element EL according to the data voltage Data.

The fifth switching transistor T5 includes a gate node that is connected to an (n−1)th emission control signal line to which an (n−1)th emission control signal EM[n−1] is provided, a drain node that is connected to the third node N3, and a source node that is connected to a fourth node N4. In order to sample the threshold voltage of the driving transistor T2 through a coupling effect of the storage capacitor Cst, the fifth switching transistor T5 is turned on and provides the data voltage Data of the third node N3 to the fourth node N4. Also, while the light emitting element EL emits light, the fifth switching transistor T5 is turned on and provides a driving current to the light emitting element EL.

The sixth switching transistor T6 includes a gate node that is connected to the second scan signal line to which the first scan signal Scan1 is provided, a source node that is connected to an initialization voltage line to which an initialization voltage Vini is provided, and a drain node that is connected to the fourth node N4.

The sixth switching transistor T6 is turned on by the first scan signal Scan1 and supplies the initialization voltage Vini to the fourth node N4 to thereby discharge the anode of the light emitting element EL.

The storage capacitor Cst is connected to the first node N1 and the fourth node N4 and stores a voltage applied to the gate node of the driving transistor T2.

The storage capacitor Cst is electrically connected to the first node N1 and the fourth node N4 and stores a difference between the voltage supplied to the gate node of the driving transistor T2 and a voltage supplied to the anode of the light emitting element EL.

Hereinafter, a structure of the driving transistor T2 will be described in detail.

Figure 4:
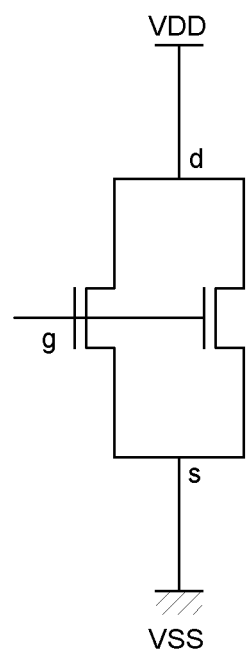
FIG. 4 is a detailed circuit diagram of a pixel emission driving element T2 of FIG. 3 according to an embodiment of the present disclosure.

FIG. 4 is a detailed circuit diagram of the pixel emission driving element T2 of FIG. 3 according to an embodiment of the present disclosure.

According to exemplary embodiments herein, the driving transistor T2 may be designed by connecting two transistors in parallel as shown in FIG. 4 because S-Factor characteristics allowing for driving current supply performance and low grayscale expression are required. Accordingly, driving performance of the sub-pixel SPX may be greatly improved.

In the present disclosure, as shown in FIG. 3, it is described that each sub-pixel SPX includes the organic light emitting element, the first to sixth transistors T1 to T6, and the storage capacitor Cst, but the present disclosure is not limited thereto. For example, in the display device according to the exemplary embodiment of the present disclosure, each sub-pixel SPX may include a light emitting element, first to seventh transistors, and a storage capacitor Cst.

Figure 5:
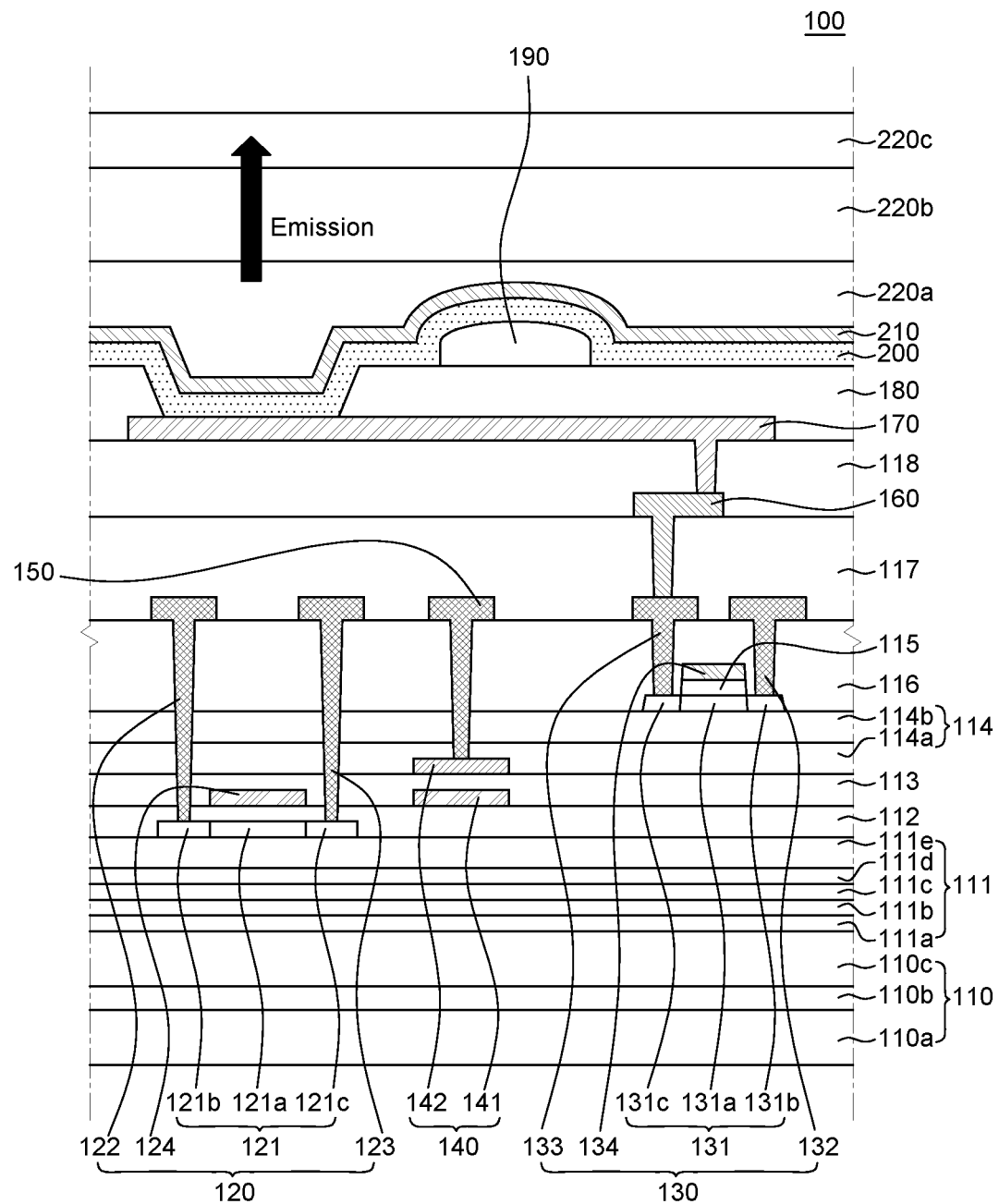
FIG. 5 is a cross-sectional view of the display device according to an exemplary embodiment of the present disclosure.

FIG. 5 is a cross-sectional view of the display device according to an exemplary embodiment of the present disclosure.

Referring to FIG. 5, the display device 100 according to an exemplary embodiment of the present disclosure may include a substrate 110, a first buffer layer 111, a first thin film transistor 120, a second thin film transistor 130, a storage capacitor 140, a first gate insulating layer 112, a first interlayer insulating layer 113, a second buffer layer 114, a second gate insulating layer 115, a second interlayer insulating layer 116, a first planarization layer 117, a second planarization layer 118, a first electrode 170, a connection electrode 150, a bank 180, an auxiliary electrode 160, a spacer 190, a light emitting structure 200, a second electrode 210 and encapsulation units 220*a*, 220*b*, and 220*c*.

The substrate 110 may support various components of the display device 100. The substrate 110 may be formed of glass or a plastic material having flexibility. When the substrate 110 is formed of a plastic material, it may be formed of, for example, polyimide (PI). When the substrate 110 is formed of polyimide (PI), a display device manufacturing process is conducted in a situation where a support substrate formed of glass is disposed under the substrate 110, and after the display device manufacturing process is completed, the support substrate can be released. Also, after the support substrate is released, a back plate for supporting the substrate 110 may be disposed under the substrate 110.

When the substrate 110 is formed of polyimide (PI), moisture permeates through the substrate 110 formed of polyimide (PI) to the first thin film transistor 120 or the light emitting structure 200, so that performance of the display device 100 may be degraded. The display device 100 according to the exemplary embodiment of the present disclosure may be formed of double polyimides (PI) in order to prevent the performance of the display device 100 from being degraded due to moisture permeation. And, by forming an inorganic layer between two polyimides (PI), it is possible to block a moisture component from passing through a lower polyimide (PI), so that product performance reliability can be improved.

In addition, when an inorganic layer is formed between two polyimides (PI), electric charges that are charged in a lower polyimide PI form a back bias, which may affect the first thin film transistor 120. Therefore, it is necessary to form a separate metal layer in order to block the electric charges that are charged in the polyimide (PI). However, in the display device 100 according to the exemplary embodiment of the present disclosure, electric charges charged in the lower polyimide PI may be blocked by forming an inorganic layer between the two polyimides PI, so that product reliability can be improved. In addition, since a process of forming a metal layer in order to block the electric charge charged in the polyimide (PI) can be omitted, process simplification may be allowed and a production cost can be reduced.

In a product of a flexible display device using polyimide (PI) as the substrate 110, it is very important to secure environmental reliability performance and performance reliability of the panel.

The display device 100 according to the exemplary embodiment of the present disclosure may implement a structure for securing environmental reliability performance of a product by using double polyimides (PI) as a substrate. For example, as shown in FIG. 5, the substrate 110 of the display device 100 may include a first polyimide layer 110a, a second polyimide layer 110c, and an inorganic insulating layer 110b formed between the first polyimide layer 110a and the second polyimide layer 110c. In a case in which electric charges are charged in the first polyimide layer 110a, the inorganic insulating layer 110b may serve to block the electric charge from affecting the first thin film transistor 120 through the second polyimide layer 110c. In addition, the inorganic insulating layer 110b formed between the first polyimide layer 110a and the second polyimide layer 110c may serve to block a moisture component from passing through and penetrating the first polyimide layer 110a.

The inorganic insulating layer 110b may be formed of a single layer of silicon nitride (SiNx) or silicon oxide (SiOx) or multiple layers thereof. In the display device 100 according to the exemplary embodiment of the present disclosure, the inorganic insulating layer 110b may be formed of a silicon oxide (SiOx) material. For example, the inorganic insulating layer 110b may be formed of a silicon dioxide material (silica or silicon dioxide: $SiO_2$). However, the present disclosure is not limited thereto, and the inorganic insulating layer 110b may be formed of double layers of silicon dioxide ($SiO_2$) and silicon nitride (SiNx).

The first buffer layer 111 may be formed on an entire surface of the substrate 110. The first buffer layer 111 may be formed of a single layer of silicon nitride (SiNx) or silicon oxide (SiOx) or multiple layers thereof. The first buffer layer 111 may improve adhesion between layers formed on the first buffer layer 111 and the substrate 110, and block alkali components and the like, leaking from the substrate 110. In addition, the first buffer layer 111 is not an essential component, and may be omitted based on a type and material of the substrate 110, a structure and type of the thin film transistor, and the like.

According to an exemplary embodiment of the present disclosure, the first buffer layer 111 may be formed as a multilayer in which silicon dioxide ($SiO_2$) and silicon nitride (SiNx) are alternately formed. Specifically, the first buffer layer 111 may be formed of (n+1) layers. Here, n means an even number including 0, such as 0, 2, 4, 6, or 8. Accordingly, when n=0, the first buffer layer 111 is formed as a single layer. In addition, the first buffer layer 111 may be silicon nitride (SiNx) or silicon oxide (SiOx). When n=2, the first buffer layer 111 may be formed as a triple layer. When the first buffer layer 111 is formed as a triple layer, an upper layer and a lower layer thereof may be silicon oxide (SiOx), and an intermediate layer thereof disposed between the upper layer and the lower layer may be silicon nitride (SiNx). And, when n=4, the first buffer layer 111 may be formed of a quintuple layer. When the first buffer layer 111 is formed of a quintuple layer, as shown in FIG. 5, a 1-a buffer layer 111a may be formed on the substrate 110. In addition, the 1-a buffer layer 111a may be formed of a silicon dioxide ($SiO_2$) material. In addition, a 1-b buffer layer 111b may be formed of a silicon nitride (SiNx) material, and may be disposed on the 1-a buffer layer 111a. In addition, a 1-c buffer layer 111c may be formed of a silicon dioxide ($SiO_2$) material, and may be disposed on the 1-b buffer layer 111b. In addition, a 1-d buffer layer 111d may be formed of a silicon nitride (SiNx) material, and may be disposed on the 1-c buffer layer 111c. In addition, a 1-e buffer layer 111e may be formed of a silicon dioxide (SiO2) material, and may be disposed on the 1-d buffer layer 111d. As such, when n is an even number greater than or equal to 2, the first buffer layer 111 may be formed as a multilayer in which silicon oxide (SiOx) and silicon nitride (SiNx) are alternately formed. In addition, an uppermost layer and a lowermost layer of the first buffer layer 111 that is formed of the multilayer may be formed of a silicon oxide (SiOx) material. For example, the first buffer layer 111 formed of a plurality of layers may include an upper layer in contact with a first active layer 121 of the first thin film transistor 120, a lower layer in contact with the substrate 110, and an intermediate layer positioned between the upper and lower layers. In addition, the upper layer and the lower layer may be formed of a silicon oxide (SiOx) material. In addition, the upper layer of the first buffer layer 111 formed of the multilayer may be formed to be thicker than thicknesses of the lower layer and the intermediate layer. In the first buffer layer 111 formed of the plurality of layers, a thickness of the upper layer in contact with the first active layer 121 of the first thin film transistor 120 may be greater than the thicknesses of the lower layer and the intermediate layer of the first buffer layer 111. For example, when the first buffer layer 111 is a quintuple layer as shown in FIG. 5, the 1-e buffer layer 111e in contact with the first active layer 121 may be an upper layer. In addition, the 1-a buffer layer 111a in contact with the substrate 110 may be a lower layer. In addition, the 1-b buffer layer 111b, the 1-c buffer layer 111c, and the 1-d buffer layer 111d that are disposed between the 1-a buffer layer 111a and the 1-e buffer layer 111e may be intermediate layers. Here, a thickness of the 1-e buffer layer 111e which is the upper layer may be greater than a thickness of the 1-a buffer layer 111a which is the lower layer and a thickness of each of the 1-b buffer layer 111b, the 1-c buffer layer 111c, and the 1-d buffer layer 111d which are the intermediate layers. More specifically, the 1-e buffer layer 111e may have a thickness of 3000 Å, and the 1-a buffer layer 111a may have a thickness of 1000 Å. In addition, the 1-b buffer layer 111b, the 1-c buffer layer 111c, and the 1-d buffer layer 111d may each have a thickness of 1000 Å.

In addition, in the first buffer layer 111 formed of the plurality of layers, a plurality of remaining layers except for the upper layer in contact with the first active layer 121 of the first thin film transistor 120 may all have the same thickness. For example, the 1-a buffer layer 111a, the 1-b buffer layer 111b, the 1-c buffer layer 111c and the 1-d buffer layer 111d, except for the 1-e buffer layer 111e in contact with the first active layer 121 may have the same thickness.

The first thin film transistor 120 may be disposed on the first buffer layer 111. The first thin film transistor 120 may include the first active layer 121, a first gate electrode 124, a first source electrode 122, and a first drain electrode 123. Here, according to a design of the pixel circuit, the first source electrode 122 may be a drain electrode, and the first drain electrode 123 may be a source electrode. The first active layer 121 of the first thin film transistor 120 may be disposed on the first buffer layer 111.

The first active layer 121 may include low temperature poly-silicon (LTPS). Since a polysilicon material has high mobility (100 cm$^2$/Vs or more), it has low energy consumption, and excellent reliability and thus, can be applied to a multiplexer (MUX) and/or a gate driver for a driving element that drives thin film transistors for a display device and can be applied as an active layer of the driving thin film transistor in the display device according to the embodiment. However, the present disclosure is not limited thereto. For example, it may be applied as an active layer of the switching thin film transistor according to characteristics of the display device. Polysilicon is formed by depositing an amorphous silicon (a-Si) material on the first buffer layer 111 and performing a dehydrogenation process and a crystallization process, and the first active layer 121 may be formed by patterning the polysilicon. The first active layer 121 may include a first channel region 121a in which a channel is formed when the first thin film transistor 120 is driven, and a first source region 121b and a first drain region 121c on both sides of the first channel region 121a. The first source region 121b means a portion of the first active layer 121 that is connected to the first source electrode 122, and the first drain region 121c means a portion of the first active layer 121 that is connected to the first drain electrode 123. The first source region 121b and the first drain region 121c may be formed by ion doping (impurity doping) of the first active layer 121. The first source region 121b and the first drain region 121c may be formed by performing ion-doping on the polysilicon material, and the first channel region 121a may refer to a portion that is not ion-doped and is left as a polysilicon material.

The first gate insulating layer 112 may be disposed on the first active layer 121 of the first thin film transistor 120. The first gate insulating layer 112 may be formed of a single layer of silicon nitride (SiNx) or silicon oxide (SiOx) or multiple layers thereof. Contact holes for connecting the first source electrode 122 and the first drain electrode 123 of the first thin film transistor 120 to the first source region 121b and the first drain region 121c of the first active layer 121 of the first thin film transistor 120, respectively, may be formed in the first gate insulating layer 112.

The first gate electrode 124 of the first thin film transistor 120 and a first capacitor electrode 141 of the storage capacitor 140 may be disposed on the first gate insulating layer 112.

The first gate electrode 124 and the first capacitor electrode 141 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The first gate electrode 124 may be formed on the first gate insulating layer 112 to overlap the first channel region 121a of the first active layer 121 of the first thin film transistor 120. The first capacitor electrode 141 may be omitted based on driving characteristics of the display device 100 and a structure and type of the thin film transistor. The first gate electrode 124 and the first capacitor electrode 141 may be formed by the same process. In addition, the first gate electrode 124 and the first capacitor electrode 141 may be formed of the same material, and may be formed on the same layer.

The first interlayer insulating layer 113 may be disposed on the first gate insulating layer 112, the first gate electrode 124, and the first capacitor electrode 141. The first interlayer insulating layer 113 may be formed of a single layer of silicon nitride (SiNx) or silicon oxide (SiOx) or multiple layers thereof. Contact holes for exposing the first source region 121b and the first drain region 121c of the first active layer 121 of the first thin film transistor 120 may be formed in the first interlayer insulating layer 113.

A second capacitor electrode 142 of the storage capacitor 140 may be disposed on the first interlayer insulating layer 113. The second capacitor electrode 142 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The second capacitor electrode 142 may be formed on the first interlayer insulating layer 113 to overlap the first capacitor electrode 141. In addition, the second capacitor electrode 142 may be formed of the same material as the first capacitor electrode 141. The second capacitor electrode 142 may be omitted based on driving characteristics of the display device 100 and the structure and type of the thin film transistor.

The second buffer layer 114 may be disposed on the first interlayer insulating layer 113 and the second capacitor electrode 142. The first buffer layer 114 may be formed of a single layer of silicon nitride (SiNx) or silicon oxide (SiOx) or multiple layers thereof. In the second buffer layer 114, contact holes for exposing the first source region 121b and the first drain region 121c of the first active layer 121 of the first thin film transistor 120 may be formed. In addition, a contact hole for exposing the second capacitor electrode 142 of the storage capacitor 140 may be formed.

A second active layer 131 of the second thin film transistor 130 may be disposed on the second buffer layer 114. The second thin film transistor 130 may include the second active layer 131, the second gate insulating layer 115, a second gate electrode 134, a second source electrode 132, and a second drain electrode 133. Here, according to the design of the pixel circuit, the second source electrode 132 may be a drain electrode, and the second drain electrode 133 may be a source electrode.

The second active layer 131 may include a second channel region 131a in which a channel is formed when the second thin film transistor 130 is driven, and a second source region 131b and a second drain region 131c on both sides of the second channel region 131a. The second source region 131b may mean a portion of the second active layer 131 that is connected to the second source electrode 132, and the second drain region 131c may mean a portion of the second active layer 131 that is connected to the second drain electrode 133.

The second active layer 131 may be formed of an oxide semiconductor. Since an oxide semiconductor material has a larger bandgap compared to a silicon material, electrons do not cross the bandgap in an off state, and thus, an off-current is low. Accordingly, a thin film transistor including an active layer formed of an oxide semiconductor may be suitable for a switching thin film transistor having a short on time and a long off time, but is not limited thereto. Depending on characteristics of the display device, it may be applied as a driving thin film transistor. And, since the off-current is small, a size of an auxiliary capacitor may be reduced, which is suitable for a high-resolution display device. For example, the second active layer 131 may be formed of a metal oxide, for example, may be formed of various metal oxides such as indium-gallium-zinc-oxide (IGZO) and the like. A description is made that the second active layer 131 of the second thin film transistor 130 is formed based on an IGZO layer, assuming that it is formed of IGZO among various metal oxides, but the present disclosure is not limited thereto. The second active layer 131 of the second thin film transistor 130 may be formed of another metal oxide such as IZO (indium-zinc-oxide), IGTO (indium-gallium-tin-oxide), or IGO (indium-gallium-oxide).

The second active layer 131 may be formed by depositing a metal oxide on the second buffer layer 114, performing a heat treatment process for stabilization, and then, patterning the metal oxide.

An insulating material layer and a metallic material layer may be sequentially formed on the entire surface of the substrate including the second active layer 131, and a photoresist pattern may be formed on the metallic material layer.

The insulating material layer may be formed using a PECVD method, and the metallic material layer may be formed using a sputtering method.

The second gate electrode 134 may be formed by wet-etching the metallic material layer using a photoresist pattern PR as a mask. As a wet etchant for etching the metallic material layer, a material which selectively etches molybdenum (Mo), copper (Cu), titanium (Ti), aluminum (Al), chromium (Cr), gold (Au), nickel (Ni) and neodymium (Nd) or an alloy thereof that constitute the metallic material layer, and which does not etch the insulating material layer may be used.

The second gate insulating layer 115 may be formed by dry etching the insulating material layer using a photoresist pattern PR and the second gate electrode 134 as a mask.

Through the dry etching process, the insulating material layer may be etched to form a pattern of the second gate insulating layer 115 on the second active layer 131. In addition, a portion of the second active layer 131 that is exposed by the patterned second gate insulating layer 115 may be conductive by a dry etching process.

The second active layer 131 including the second channel region 131a that is not conductive corresponding to an area in which the second gate electrode 134 is formed, and the second source region 131b and the second drain region 131c that are conductive at both ends of the second active layer 131 may be formed.

As a resistance of the second source region 131b and the second drain region 131c of the second active layer 131 that are conductive is lowered, element performance of the second thin film transistor 130 may be improved and accordingly, it is possible to obtain an effect that reliability of the display device 100 according to the exemplary embodiment of the present disclosure can be improved.

The second channel region 131a of the second active layer 131 may be disposed to overlap the second gate electrode 134. In addition, the second source region 131b and the second drain region 131c of the second active layer 131 may be disposed on both sides of the second channel region 131a. In addition, the second gate insulating layer 115 may be disposed between the second gate electrode 134 and the second active layer 131. In addition, the second gate insulating layer 115 may be disposed to overlap the second gate electrode 134 and the second channel region 131a of the second active layer 131.

As the insulating material layer and the metallic material layer are etched using the photoresist pattern PR as a mask, the second gate insulating layer 115 and the second gate electrode 134 may be formed in the same pattern. The second gate insulating layer 115 may be disposed on the second active layer 131. The second gate insulating layer 115 may be composed of a single layer of silicon nitride (SiNx) or silicon oxide (SiOx) or multiple layers thereof. The second gate insulating layer 115 may be patterned to overlap the second channel region 131a of the second active layer 131. The second gate electrode 134 may be disposed on the second gate insulating layer 114. The second gate electrode 134 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The second gate electrode 134 may be patterned to overlap the second active layer 131 and the second gate insulating layer 115. The second gate electrode 134 may be patterned to overlap the second channel region 131a of the second active layer 131. In addition, the second gate insulating layer 115 may be patterned to overlap the second channel region 131a of the second active layer 131. Accordingly, the second gate electrode 134 and the second gate insulating layer 115 may overlap the second channel region 131a of the second active layer 131. The second interlayer insulating layer 116 may be disposed on the second buffer layer 114, the second active layer 131, and the second gate electrode 134. Contact holes for exposing the first active layer 121 of the first thin film transistor 120 and the second active layer 131 of the second thin film transistor 130 may be formed in the second interlayer insulating layer 116. For example, contact holes for exposing the first source region 121b and the first drain region 121c of the first active layer 121 in the first thin film transistor 120 may be formed in the second interlayer insulating layer 116. In addition, contact holes for exposing the second source region 131b and the second drain region 131c of the second active layer 131 in the second thin film transistor 130 may be formed in the second interlayer insulating layer 116. The second interlayer insulating layer 116 may be composed of a single layer of silicon nitride (SiNx) or silicon oxide (SiOx) or multiple layers thereof.

On the second interlayer insulating layer 116, the connection electrode 150, the first source electrode 122 and the second drain electrode 123 of the first thin film transistor 120, and the second source electrode 132 and the second drain electrode 133 of the second thin film transistor 130 may be disposed.

The first source electrode 122 and the first drain electrode 123 of the first thin film transistor 120 may be connected to the first active layer 121 of the first thin film transistor 120 through the contact holes formed in the first gate insulating layer 112, the first interlayer insulating layer 113, the second buffer layer 114, and the second interlayer insulating layer 116. Accordingly, the first source electrode 122 of the first thin film transistor 120 may be connected to the first source region 121b of the first active layer 121 through the contact hole formed in the first gate insulating layer 112, the first interlayer insulating layer 113, the second buffer layer 114, and the second interlayer insulating layer 116. In addition, the first drain electrode 123 of the first thin film transistor 120 may be connected to the first drain region 121c of the first active layer 121 through the contact hole formed in the first gate insulating layer 112, the first interlayer insulating layer 113, the second buffer layer 114, and the second interlayer insulating layer 116.

In addition, the connection electrode 150 may be electrically connected to the second drain electrode 133 of the second thin film transistor 130. In addition, the connection electrode 150 may be electrically connected to the second capacitor electrode 142 of the storage capacitor 140 through a contact hole formed in the second buffer layer 114 and the second interlayer insulating layer 116. Accordingly, the connection electrode 150 may serve to electrically connect the second capacitor electrode 142 of the storage capacitor 140 and the second drain electrode 133 of the second thin film transistor 130.

In addition, the second source electrode 132 and the second drain electrode 133 of the second thin film transistor 130 may be connected to the second active layer 131 through contact holes formed in the second interlayer insulating layer 116. Accordingly, the second source electrode 132 of the second thin film transistor 130 may be connected to the second source region 131b of the second active layer 131 through the contact hole formed in the second interlayer insulating layer 116, and the second drain electrode 133 of the second thin film transistor 130 may be connected to the second drain region 131c of the second active layer 131 through the contact hole formed in the second interlayer insulating layer 116.

The connection electrode 150, the first source electrode 122 and the second drain electrode 123 of the first thin film transistor 120, and the second source electrode 132 and the second drain electrode 133 of the second thin film transistor 130 may be formed by the same process. In addition, the connection electrode 150, the first source electrode 122 and the second drain electrode 123 of the first thin film transistor 120, and the second source electrode 132 and the second drain electrode 133 of the second thin film transistor 130 may be formed of the same material. The connection electrode 150, the first source electrode 122 and the second drain electrode 123 of the first thin film transistor 120, and the second source electrode 132 and the second drain electrode 133 of the second thin film transistor 130 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. For example, the connection electrode 150, the first source electrode 122 and the second drain electrode 123 of the first thin film transistor 120, and the second source electrode 132 and the second drain electrode 133 of the second thin film transistor 130 may have a three-layer structure of titanium (Ti)/aluminum (Al)/titanium (Ti), which is formed of a conductive metallic material, but the present disclosure is not limited thereto.

The connection electrode 150 may be integrally formed with the second drain electrode 133 of the second thin film transistor 130 and connected thereto.

The first planarization layer 117 may be disposed on the connection electrode 150, the first source electrode 122 and the second drain electrode 123 of the first thin film transistor 120, the second source electrode 132 and the second drain electrode 133 of the second thin film transistor 130, and the second interlayer insulating layer 116. As shown in FIG. 5, a contact hole for exposing the second drain electrode 133 may be formed in the first planarization layer 117, but is not limited thereto. For example, a contact hole for exposing the second source electrode 132 of the second thin film transistor 130 may be formed in the first planarization layer 117. Alternatively, a contact hole for exposing the connection electrode 150 that is electrically connected to the second drain electrode 133 of the second thin film transistor 130 may be formed in the first planarization layer 117. The first planarization layer 117 may be an organic material layer for planarizing and protecting upper portions of the first thin film transistor 120 and the second thin film transistor 130. For example, the planarization layer 118 may be formed of an organic material such as an acrylic resin, an epoxy resin, a phenolic resin, a polyamide resin, or a polyimide resin.

The auxiliary electrode 160 may be disposed on the first planarization layer 117. In addition, the auxiliary electrode 160 may be connected to the second drain electrode 133 of the second thin film transistor 130 through the contact hole of the first planarization layer 117. The auxiliary electrode 160 may serve to electrically connect the second thin film transistor 130 and the first electrode 170. The auxiliary electrode 160 may be formed as a single layer or multilayer composed of any one of molybdenum (Mo), copper (Cu), titanium (Ti), aluminum (Al), chromium (Cr), gold (Au), nickel (Ni), and neodymium (Nd), or an alloy of them. The auxiliary electrode 160 may be formed of the same material as the second source electrode 132 and the second drain electrode 133 of the second thin film transistor 130.

The second planarization layer 118 may be disposed on the auxiliary electrode 160 and the first planarization layer 117. Also, as shown in FIG. 5, a contact hole for exposing the auxiliary electrode 160 may be formed in the second planarization layer 118. The second planarization layer 118 may be an organic material layer for planarizing upper portions of the first thin film transistor 120 and the second thin film transistor 130. For example, the second planarization layer 118 may be formed of an organic material such as an acrylic resin, an epoxy resin, a phenolic resin, a polyamide resin, and a polyimide resin.

The first electrode 170 may be disposed on the second planarization layer 118. The first electrode 170 may be electrically connected to the auxiliary electrode 160 through the contact hole formed in the second planarization layer 118. Accordingly, the first electrode 170 may be electrically connected to the second thin film transistor 130 by being connected to the auxiliary electrode 160 through the contact hole formed in the second planarization layer 118.

The first electrode 170 may be formed in a multilayer structure including a transparent conductive layer and an opaque conductive layer having high reflective efficiency. The transparent conductive layer may be formed of a material having a relatively large work function value, such as indium-tin-oxide (ITO) or indium-zinc-oxide (IZO). In addition, the opaque conductive layer may have a single layer or multilayer structure including Al, Ag, Cu, Pb, Mo, and Ti, or an alloy thereof. For example, the first electrode 170 may be formed in a structure in which a transparent conductive layer, an opaque conductive layer, and a transparent conductive layer are sequentially stacked. However, the present disclosure is not limited thereto, and a structure in which a transparent conductive layer and an opaque conductive layer are sequentially stacked may also be formed.

Since the display device 100 according to the exemplary embodiment of the present disclosure is a top emission display device, the first electrode 170 may be an anode electrode. When the display device 100 is a bottom emission display device, the first electrode 170 disposed on the second planarization layer 118 may be a cathode electrode.

The bank 180 may be disposed on the first electrode 170 and the second planarization layer 118. An opening for exposing the first electrode 170 may be formed in the bank 180. The bank 180 may define a light emitting area of the display device 100 and thus may be referred to as a pixel defining layer. The spacer 190 may be further disposed on the bank 180. In addition, the light emitting structure 200 including a light emitting layer may be further disposed on the first electrode 170.

The light emitting structure 200 may be formed by stacking a hole layer, the light emitting layer, and an electron layer on the first electrode 170 in the order or in a reverse order. In addition, the light emitting structure 200 may include a first light emitting structure and a second light emitting structure that face each other with a charge generating layer interposed therebetween. In this case, the light emitting layer of any one of the first and second light emitting structures generates blue light, and the light emitting layer of the other of the first and second light emitting structures generates yellow-green light, so that white light may be generated through the first and second light emitting structures. White light generated by the light emitting structure 200 may be incident on a color filter (not shown) positioned on the light emitting structure 200 to implement a color image. In addition, a color image may be implemented by generating colored light corresponding to each sub-pixel in each light emitting structure 200 without a separate color filter. That is, the light emitting structure 200 of the red (R) sub-pixel may generate red light, the light emitting structure 200 of the green (G) sub-pixel may generate green light, and the light emitting structure 200 of the blue (B) sub-pixel may generate blue light.

The second electrode 210 may be further disposed on the light emitting structure 200. The second electrode 210 may be disposed on the light emitting structure 200 to face the first electrode 170 with the light emitting structure 200 interposed therebetween. In the display device 100 according to the exemplary embodiment of the present disclosure, the second electrode 210 may be a cathode electrode. The encapsulation units 220a, 220b, and 220c for suppressing penetration of moisture may be further disposed on the second electrode 210.

The encapsulation units 220a, 220b, and 220c may include a first inorganic encapsulation layer 220a, a second organic encapsulation layer 220b, and a third inorganic encapsulation layer 220c. The first inorganic encapsulation layer 220a of the encapsulation units 220a, 220b, and 220c may be disposed on the second electrode 210. In addition, the second organic encapsulation layer 220b may be disposed on the first inorganic encapsulation layer 220a. Also, the third inorganic encapsulation layer 220c may be disposed on the second organic encapsulation layer 220b. The first inorganic encapsulation layer 220a and the third inorganic encapsulation layer 220c of the encapsulation units 220a, 220b, and 220c may be formed of an inorganic material such as silicon nitride (SiNx) or silicon oxide (SiOx). The second organic encapsulation layer 220b of the encapsulation units 220a, 220b, and 220c may be formed of an organic material such as an acrylic resin, an epoxy resin, a phenolic resin, a polyamide resin, and a polyimide resin.

Figure 6:
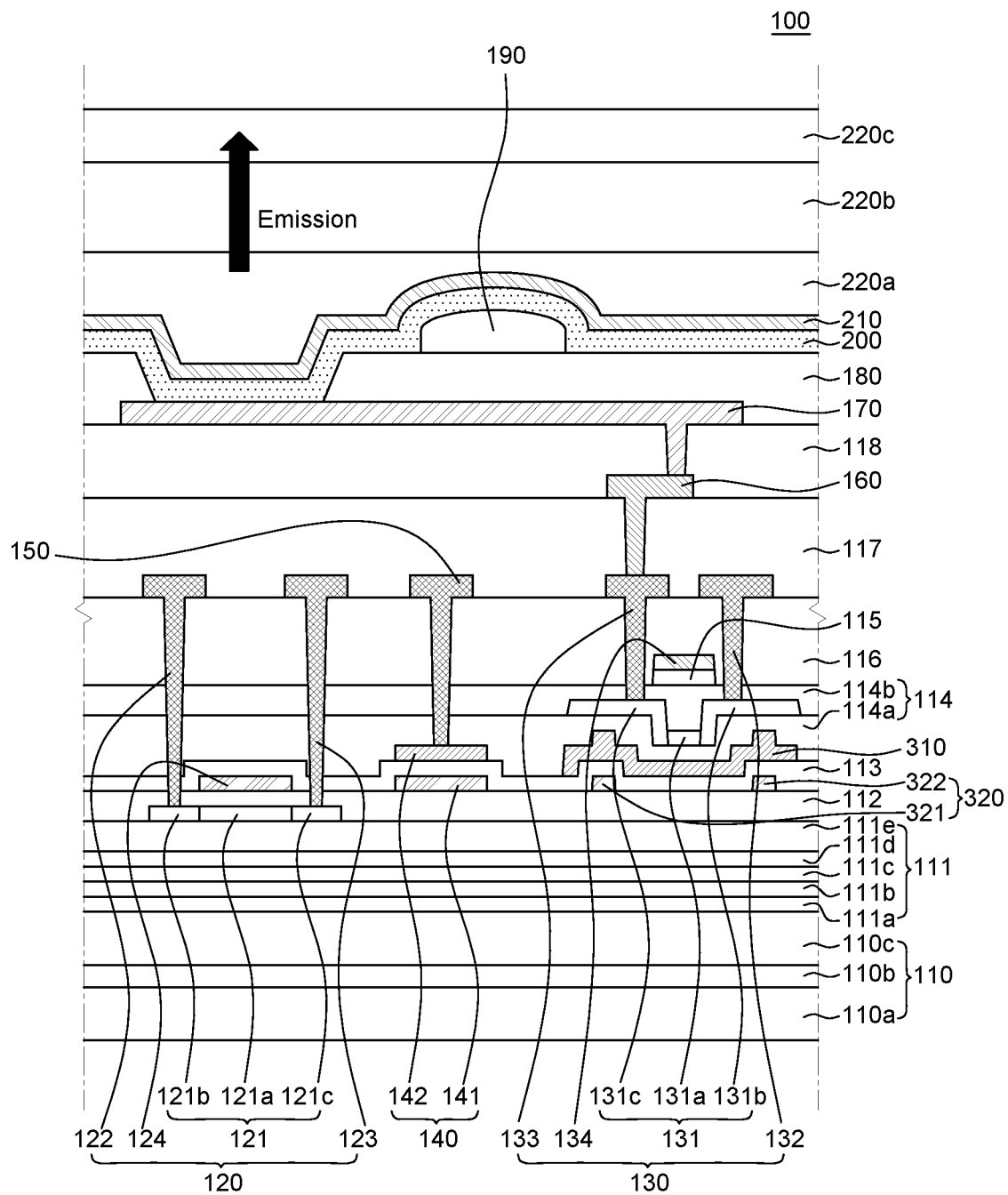
FIG. 6 is a cross-sectional view of a display device according to another exemplary embodiment of the present disclosure.

FIG. 6 is a cross-sectional view of a display device according to another exemplary embodiment of the present disclosure.

It will be described together with reference to FIG. 5, and redundant descriptions will be omitted or briefly described. For example, the substrate 110, the first buffer layer 111, the first gate insulating layer 112, the first interlayer insulating layer 113, the second buffer layer 114, the second gate insulating layer 115, the second interlayer insulating layer 116, the first planarization layer 117, the second planarization layer 118, the connection electrode 150, the auxiliary electrode 160, the first electrode 170, the bank 180, the spacer 190, the light emitting structure 200, the second electrode 210, the encapsulation units 220a, 220b, and 220c, the first thin film transistor 120, and the second thin film transistor 130 are substantially the same. Accordingly, redundant descriptions of components of FIG. 6 that are substantially identical to those of FIG. 5 will be omitted or briefly described.

Referring to FIG. 6, the display device 100 according to another exemplary embodiment of the present disclosure may include the substrate 110, the first buffer layer 111, the first thin film transistor 120, the second thin film transistor 130, the first gate insulating layer 112, the first interlayer insulating layer 113, the second buffer layer 114, the second gate insulating layer 115, the second interlayer insulating layer 116, the first planarization layer 117, the second planarization layer 118, the storage capacitor 140, a light blocking layer 310, protrusion patterns 320, the connection electrode 150, the bank 180, the auxiliary electrode 160, the first electrode 170, the spacer 190, the light emitting structure 200, the second electrode 210, and the encapsulation units 220a, 220b, and 220c. In addition, the first active layer 121 of the first thin film transistor 120 may be formed of LIPS, and the second active layer 131 of the second thin film transistor 130 may be formed of an oxide semiconductor.

The display device 100 according to the exemplary embodiment of the present disclosure may further include the light blocking layer 310 in an area overlapping the second active layer 131 of the second thin film transistor 130 in order to block external light capable of changing the characteristics of the second active layer 131 of the second thin film transistor 130 that is formed of the oxide semiconductor, and/or light that is refracted from the light emitting structure 200 and incident. The light blocking layer 310 may be formed together with the second capacitor electrode 142 of the storage capacitor 140 during a process for forming the second capacitor electrode 142 of the storage capacitor 140. In one embodiment, the light blocking layer 310 includes a first portion below the active layer 131 of the second thin film transistor 130 and a second portion that extends upward to horizontally overlap with at least a part of the active layer 131 such that external light can be blocked.

The protrusion patterns 320 may be further included in an area overlapping the light blocking layer 310 under the light blocking layer 310. The protrusion patterns 320 may include a first protrusion pattern 321 and a second protrusion pattern 322 that is spaced apart from the first protrusion pattern 321. The first protrusion pattern 321 and the second protrusion pattern 322 may be formed together during a process for forming the first gate electrode 124 of the first thin film transistor 120. That is, the first protrusion pattern 321 and the second protrusion pattern 322 may be formed together during a process for forming the first capacitor electrode 141 of the storage capacitor 140. A distance between the first protrusion pattern 321 and the second protrusion pattern 322 may be formed to be greater than a width of the second channel region 131*a* of the second active layer 131. That is, the first protrusion pattern 321 and the second protrusion pattern 322 may be formed so as not to overlap the second channel region 131*a* of the second active layer 131. For example, the first protrusion pattern 321 may be formed to overlap the second source region 131*b* or the second drain region 131*c* of the second active layer 131. In addition, the second protrusion pattern 322 may be formed to overlap the second drain region 131*c* or the second source region 131*b* of the second active layer 131.

Due to the first protrusion pattern 321 and the second protrusion pattern 322, the first interlayer insulating layer 113 and/or portions of the light blocking layer 310 corresponding to the first protrusion pattern 321 and the second protrusion pattern 322, which are sequentially formed on the first protrusion pattern 321 and the second protrusion pattern 322, may have steps formed in a direction of the second active layer 131 like shapes of the first protrusion pattern 321 and the second protrusion pattern 322. For example, a portion of the first interlayer insulating layer 113 may be disposed on the first gate insulating layer 112, extend along a side surface of the first protrusion pattern 321 or the second protrusion pattern 322 and be disposed on a top surface of the first protrusion pattern 321 or the second protrusion pattern 322 to form the stepped shape. The light blocking layer 310 may include a first portion disposed below the second active layer 131 and a second portion extending upward to horizontally overlap with the channel region 131*a* of the second active layer 131. The first portion and the second portion of the light blocking layer 310 may be disposed on the portion of the first interlayer insulating layer 113 with the stepped shape, and in one implementation, may also form a stepped shape along the first interlayer insulating layer 113. Moreover, as shown in FIG. 6, the light blocking layer 310 may also include a third portion that extends upward from another end of the first portion such that the first portion, the second portion, and the third portion of the light blocking layer 310 form a concave shape or a groove. Due to the steps formed in the light blocking layer 310, the light blocking layer 310 may block external light that is incident onto the second channel region 131*a* of the second active layer 131 through a lower portion and a side surface of the second active layer 131, and/or light emitted from the light emitting structure 200.

Moreover, as shown in FIG. 6, the second lower buffer layer 114*a* may be formed on the light blocking layer 310, and may be formed with a concave portion or a groove. The channel region 131*a* of the second active layer 131 may be disposed on a bottom surface of the concave portion, such that the light blocking layer 310 horizontally overlaps with a side of the channel region 131*a* of the second active layer 131. At least one or both of the source region 131*b* or the drain region 131*c* may extend from the channel region 131*a* (at the bottom surface of the concave portion) to a top surface of the lower buffer layer 114*a*.

The light blocking layer 310 may be electrically connected to the second capacitor electrode 142. Electric charges may be charged in the light blocking layer 310. In order to block the electric charges charged in the light blocking layer 310 from being transferred to the second active layer 131 of the second thin film transistor 130, it is preferable that the second buffer layer 114 is formed of multiple layers. When the second buffer layer 114 is formed of multiple layers, an uppermost layer of the second buffer layer 114 in contact with the second active layer 131 may be formed of a silicon oxide (SiOx) material having a low hydrogen content. For example, the uppermost layer of the second buffer layer 114 may be formed of a silicon dioxide (SiO2) material. In addition, at least one silicon nitride (SiNx) material layer having high insulating properties may be disposed between the uppermost layer formed of a silicon oxide (SiOx) material and the light blocking layer 310. For example, as shown in FIG. 6, when the second buffer layer 114 is formed as a double layer, the second buffer layer 114 may include a second lower buffer layer 114*a* disposed on the light blocking layer 310 and a second upper buffer layer 114*b* disposed on the second lower buffer layer 114*b*. The second upper buffer layer 114*b* in direct contact with a lower surface of the second active layer 131 may have a relatively lower hydrogen content than the second lower buffer layer 114*a*. In addition, the second lower buffer layer 114*a* disposed between the light blocking layer 310 and the second upper buffer layer 114*b* may have higher insulating properties than the second upper buffer layer 114*b*. The second upper buffer layer 114*b* of the second buffer layer 114 in direct contact with the second active layer 131 of the second thin film transistor 130 may be formed of silicon oxide (SiOx). For example, the second upper buffer layer 114*b* may be formed of silicon dioxide (SiO2). In addition, the second lower buffer layer 114*a* disposed between the second upper buffer layer 114*b* and the light blocking layer 310 may be formed of silicon nitride (SiNx).

As described above, due to the first protrusion pattern 321 and the second protrusion pattern 322 formed under the light blocking layer 310, the steps are formed in the light blocking layer corresponding to the first protrusion pattern 321 and the second protrusion pattern 322. And, due to the steps, external light that is incident onto the second channel region 131*a* of the second active layer 131 through the lower portion and the side surface of the second active layer 131, and/or light emitted from the light emitting structure 200, may be blocked. Therefore, it is possible to provide a highly reliable display device by preventing variations in oxide semiconductor element due to light.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a substrate including a first substrate, a second substrate, and an inorganic insulating layer disposed between the first substrate and the second substrate;
a first buffer layer on the substrate;
a first thin film transistor including a first active layer that is formed of a first material and includes a first source region, a first channel region, and a first drain region, a first gate electrode that overlaps the first active layer with a first gate insulating layer interposed therebetween, and a first source electrode and a first drain electrode that are electrically connected to the first active layer;

a second thin film transistor including a second active layer that is formed of a second material and includes a second source region, a second channel region, and a second drain region, a second gate electrode that overlaps the second active layer with a second gate insulating layer interposed therebetween, and a second source electrode and a second drain electrode that are electrically connected to the second active layer;

a storage capacitor including a first capacitor electrode that is disposed on a same layer as the first gate electrode, and a second capacitor electrode that overlaps the first capacitor electrode with a first interlayer insulating layer interposed therebetween;

a light blocking layer overlapping a lower portion of the second active layer and formed on a same layer as the second capacitor electrode; and a first protrusion pattern and a second protrusion pattern disposed on a same layer as the first gate electrode and overlapping the light blocking layer, wherein a distance between the first protrusion pattern and the second protrusion pattern is greater than a width of the second channel region of the second active layer.

2. The organic light emitting display device of claim 1, further comprising: a second buffer layer disposed between the light blocking layer and the second active layer and formed of a plurality of layers including a silicon oxide (SiOx) layer and a silicon nitride (SiNx) layer.

3. The organic light emitting display device of claim 2, wherein an uppermost layer of the second buffer layer in contact with the second active layer is a silicon oxide (SiOx) layer, and at least one silicon nitride (SiNx) layer is disposed between the uppermost layer and the light blocking layer.

4. The organic light emitting display device of claim 2, wherein the second buffer layer includes a second upper buffer layer and a second lower buffer layer, wherein the second upper buffer layer is a silicon oxide (SiOx) layer, and the second lower buffer layer is a silicon nitride (SiNx) layer.

5. The organic light emitting display device of claim 4, wherein the second upper buffer layer is formed of silicon dioxide (SiO2).

6. The organic light emitting display device of claim 2, wherein the first active layer of the first thin film transistor is on the first buffer layer, the first gate insulating layer is on the first active layer and the first buffer layer, the first gate electrode of the first thin film transistor and the first capacitor electrode of the storage capacitor are on the first gate insulating layer, the first interlayer insulating layer is on the first gate electrode and the first capacitor electrode, the second capacitor electrode of the storage capacitor overlapping the first capacitor electrode and the light blocking layer overlapping the second active layer are on the first interlayer insulating layer, the second buffer layer is on the second capacitor electrode, the light blocking layer, and the first interlayer insulating layer, the second active layer of the second thin film transistor is on the second buffer layer, the second gate insulating layer is on the second active layer, the second gate electrode of the second thin film transistor is on the second gate insulating layer, the organic light emitting display device further comprises a second interlayer insulating layer on the second gate electrode, the second active layer, and the second buffer layer, and the first source electrode and the first drain electrode of the first thin film transistor, and the second source electrode and the second drain electrode of the second thin film transistor are on the second interlayer insulating layer.

7. The organic light emitting display device of claim 6, wherein the second source electrode and the second drain electrode are electrically connected to the second active layer through contact holes of the second interlayer insulating layer.

8. The organic light emitting display device of claim 6, wherein the first source electrode and the first drain electrode are electrically connected to the first active layer through contact holes of the second interlayer insulating layer, the second buffer layer, the first interlayer insulating layer, and the first gate insulating layer.

9. The organic light emitting display device of claim 3, wherein the first protrusion pattern overlaps the second source region and the second protrusion pattern overlaps the second drain region.

10. The organic light emitting display device of claim 9, wherein the second channel region is closer to the substrate than the second source region and the second drain region.

11. The organic light emitting display device of claim 3, wherein the first protrusion pattern overlaps the second drain region and the second protrusion pattern overlaps the second source region.

12. The organic light emitting display device of claim 3, wherein a portion of the light blocking layer that overlaps the first protrusion pattern and the second protrusion pattern is higher than a portion of the light blocking layer that does not overlap the first protrusion pattern and the second protrusion pattern.

13. The organic light emitting display device of claim 12, wherein the light blocking layer blocks light incident through a lower portion and a side surface of the second channel region.

14. An organic light emitting display device, comprising:

a substrate including a first substrate, a second substrate, and an inorganic insulating layer disposed between the first substrate and the second substrate;

a first buffer layer on the substrate;

a first thin film transistor including a first active layer that is formed of a low-temperature polysilicon and includes a first source region, a first channel region, and a first drain region, a first gate electrode that overlaps the first active layer with a first gate insulating layer interposed therebetween, and a first source electrode and a first drain electrode that are electrically connected to the first active layer;

a second thin film transistor including a second active layer that is formed of an oxide semiconductor and includes a second source region, a second channel region, and a second drain region, a second gate electrode that overlaps the second active layer with a second gate insulating layer interposed therebetween, and a second source electrode and a second drain electrode that are electrically connected to the second active layer;

a storage capacitor including a first capacitor electrode that is disposed on a same layer as the first gate electrode, and a second capacitor electrode that overlaps the first capacitor electrode with a first interlayer insulating layer interposed therebetween; and a light blocking layer disposed under the second active layer and overlapping a lower portion of the second active layer and formed on Men a same layer as the second capacitor electrode, wherein steps are formed in the light blocking layer, which block light incident through a lower portion and a side surface of the second channel region; one or more protrusion patterns on at least a part of an insulating layer; and an interlayer insulating layer on the one or more protrusion patterns such that at least a portion of the interlayer insulating layer on the one or more protrusion patterns forms a stepped shape, wherein the one or more protrusion patterns is formed in a same layer as the first gate electrode.

15. An organic light emitting display device, comprising:
a substrate;
a first thin film transistor on the substrate, the first thin film transistor including a first active layer formed of a low-temperature polysilicon, the first thin film transistor including another gate electrode;
a second thin film transistor on the substrate, the second thin film transistor including:
an active layer formed of an oxide semiconductor and including a source region, a channel region, and a drain region,
a gate insulating layer on the active layer, and
a gate electrode on the gate insulating layer and overlapping the active layer;
a light blocking layer disposed under the active layer and overlapping the active layer, the light blocking layer having a first portion below the channel region and a second portion that extends upward to horizontally overlap with at least a part of the active layer; one or more protrusion patterns on at least a part of an insulating layer; and an interlayer insulating layer on the one or more protrusion patterns such that at least a portion of the interlayer insulating layer on the one or more protrusion patterns forms a stepped shape, wherein the one or more protrusion patterns is formed in a same layer as the another gate electrode.

16. The organic light emitting display device of claim 15, further comprising a lower buffer layer on the active layer, wherein the lower buffer layer is formed with a concave portion, and wherein the channel region of the active layer is disposed on a bottom surface of the concave portion.

17. The organic light emitting display device of claim 16, wherein the second portion of the light blocking layer horizontally overlaps with a side of the channel region of the active layer.

18. The organic light emitting display device of claim 16, wherein at least one of the source region or the drain region extends from the channel region to a top surface of the lower buffer layer.

19. The organic light emitting display device of claim 15, wherein the second portion of the light blocking layer extends upward from one end of the first portion, and wherein the light blocking layer further includes a third portion that extends upward from another end of the first portion such that the first portion, the second portion, and the third portion of the light blocking layer form a concave shape.

20. The organic light emitting display device of claim 15, wherein the one or more protrusion patterns include a first protrusion pattern and a second protrusion pattern, and a width between the first protrusion pattern and the second protrusion pattern is wider than a width of the channel region.

21. The organic light emitting display device of claim 15, wherein the first portion and the second portion of the light blocking layer is disposed on the portion of the interlayer insulating layer with the shaped shape.

22. The organic light emitting display device of claim 15, further comprising a storage capacitor, the storage capacitor including a capacitor electrode in a same layer as the light blocking layer.

* * * * *